June 20, 1967 E. J. KING, JR 3,327,222
HIGH FREQUENCY RADIO RECEIVER
Filed Oct. 14, 1963
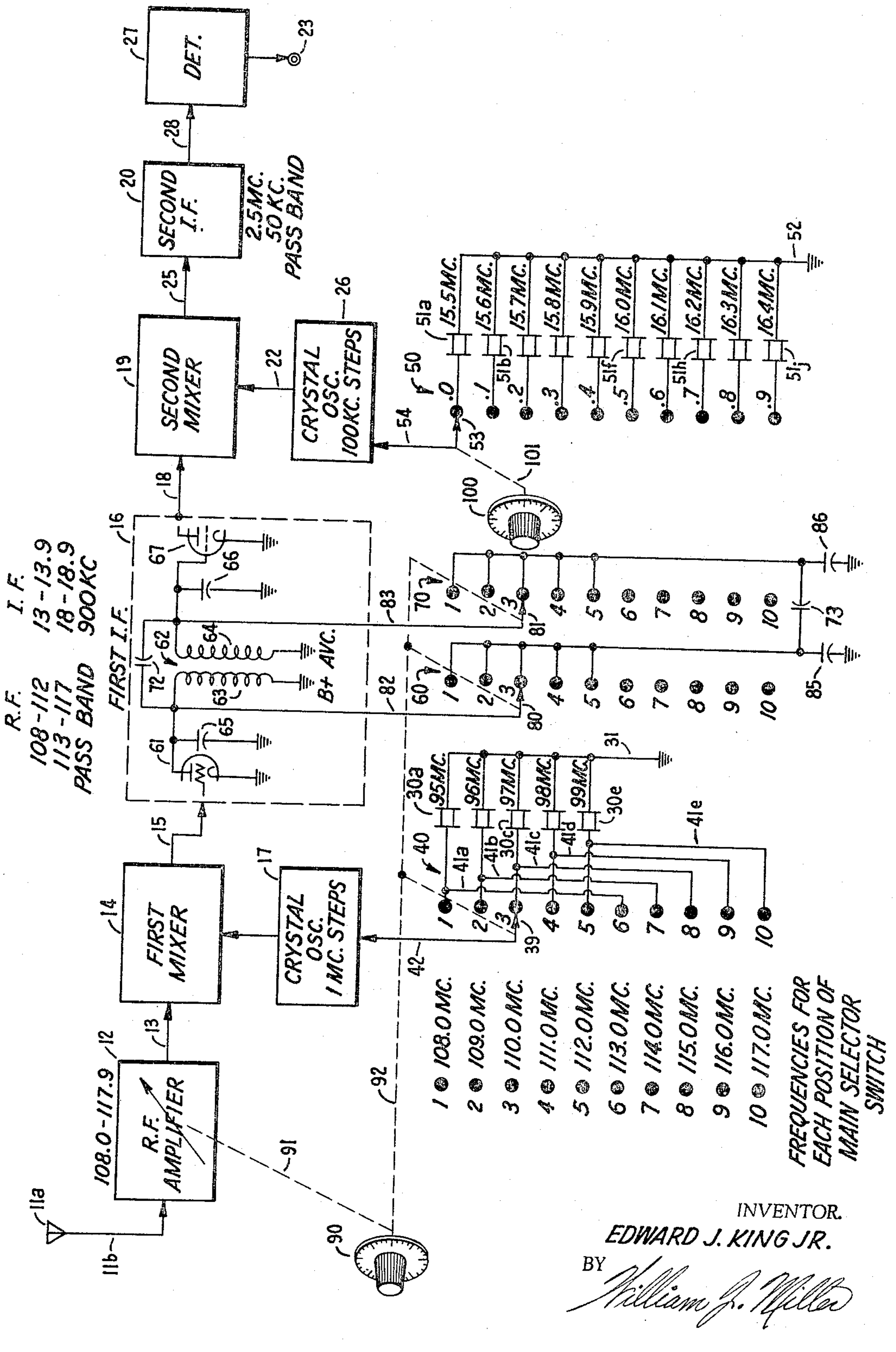
INVENTOR.
EDWARD J. KING JR.
BY William J. Miller United States Patent Office 3,327,222
Patented June 20, 1967

3,327,222

HIGH FREQUENCY RADIO RECEIVER

Edward J. King, Jr., Mission Hills, Kans., assignor to King Radio Corporation, Inc., Olathe, Kans., a corporation of Kansas Filed Oct. 14, 1963, Ser. No. 315,891
3 Claims. (Cl. 325—462)

This invention relates in general to high frequency radio receivers and in particular to a crystal saving circuit for a high frequency aircraft radio receiver.

The only practical method for constructing a high frequency radio receiver which is extremely stable is by the use of piezo-electric crystals. In the oscillators associated with the converter stages of the receiver where a large number of channels is required as, for example, in an aircraft radio receiver, the use of a crystal for each channel not only increases the cost of the receiver unreasonably, but also increases the weight and bulk of the receiver.

It is, therefore, an object of this invention to reduce the number of crystals required to stabilize a plurality of channels in a radio receiver.

It is a further object of this invention to reduce the weight of the receiver by reducing the number of crystals and corresponding circuit components.

It is a still further object of this invention to greatly reduce the number of crystals necessary to stabilize a multi-channel receiver, thereby permitting an overall reduction in the size of the receiver.

It is a still further object of this invention to provide a crystal stabilized receiving system wherein the oscillator for the first mixer stage requires no more than half the number of crystals as tunable channels on the first stage of the receiver.

This invention features a novel first converter stage in combination with a tunable first I.F. stage. The first converter stage incorporates an oscillator which uses half the number of crystals normally required for a fully crystallized stage, that is, a stage which has a crystal for each portion of the crystal selector switch. The selection of the crystals in the first converter stage and the selection of the frequencies of the I.F. stage in combination with the second converter stage are such that a single frequency output is passed to the I.F. of the second converter stage.

This invention further features a multi-channel radio frequency crystal-stabilized receiver which incorporates a radio frequency stage that is tunable over a plurality of selected frequencies. The crystal oscillator associated with the first converter stage has, for example, half the number of crystals as channels in the receiver. The crystals are connected so that they are used in successive order generally progressing from the lowest to the highest frequency in correspondence with the selection of primary channels from the lowest to the highest frequency. Since there is only half the number of crystals as primary channels in the receiver, the crystals are connected to be re-used in successive order. At the moment the selector switch is operated to reuse the crystals in successive order, the I.F. is switched from a first to a second frequency in the first converter stage. The resultant signal from the first converter stage, which will be either of two frequencies, is applied to a second crystal stabilized converter stage. The first and second frequencies from the first converter stage are selected so that when either of the signals is beat with the second converter oscillator, a single difference signal will be obtained which will pass through the I.F. stage following the second converter and fall within its pass band.

Other objects, features, and advantages of the invention will become apparent from the following description and claims when read in view of the accompanying drawing which illustrates schematically a crystal saving circuit using the techniques of this invention.

Referring to the drawing generally, the radio frequency and mixing portion of the high frequency receiver system is shown, wherein an antenna 11*a* is connected through a wire 11*b* to an R.F. amplifier 12. A means 13 connects the output of the R.F. amplifier 12 to the input of a first mixer stage 14. The output of the first mixer stage 14 is connected through a means 15 to a first I.F. stage 16. The first converter stage comprises the first mixer 14, the first I.F. stage 16 and a crystal oscillator 17 which has its output connected to a second input of the first mixer 14. The output of the first I.F. stage is connected through a means 18 to the input of a second mixer 19. The output of the second mixer stage is connected through a means 25 to the input of a second I.F. amplifier 20. Second mixer 19, second I.F. amplifier 20 and a crystal oscillator 26 electrically connected through a wire 22 to the second mixer stage 19, comprises the second converter stage. The output of the second I.F. amplifier is connected through a wire 28 to a detecting stage 27. The output of detecting stage 27 is connected to an output terminal 23.

Associated with crystal oscillator 17 is a plurality of frequency stabilizing crystals 30*a* through 30*e*. Each of the crystals 30*a* through 30*e* has one end electrically connected to ground through a means 31. The remaining ends of the crystals 30*a* through 30*e* are connected to a plurality of switch contacts on a switch 40. Each of the terminals 1 through 5 is electrically connected through wires 41*a* through 41*e* to terminals 6 through 10, respectively. Switch 40 has its sliding contact 39 connected through a conductor 42 to crystal oscillator 17.

Crystal oscillator 26 of the second converter stage likewise has a plurality of frequency stabilizing crystals, 51*a* through 51*j*, which are likewise connected to ground through a means 52. Each of the remaining ends of the crystals is connected through a wire to the switch contacts of switch 50. A sliding contact 53 of switch 50 is connected through a conductor 54 to an input of crystal oscillator 26.

The first I.F. stage of the first converter stage comprises the usual elements consisting of an amplifying tube 61, a transformer 62 having a primary 63 and a secondary 64. The resonance of the primary of transformer 62, excluding the effects of switches 60 and 70, is determined by capacitor 65 which is connected across primary 63. Secondary 64 likewise has a resonating capacitor 66. The frequency shifting network for the I.F. transformer 62 comprises a pair of switches 60 and 70 which have a plurality of contacts 1 through 10 and a sliding contact 80 and 81, respectively. Sliding contact 80 is connected through a wire 82 to one side of primary 63 and sliding contact 81 is connected through a wire 83 to one side of the secondary 64 of transformer 62. Terminals 1 through 5 of switch 80 and 1 through 5 of switch 81 are connected through capacitors 85 and 86, respectively, to ground. A knob 90 is used to switch R.F. amplifier 12 through a mechanical coupling 91 to the proper frequency. A mechanical coupling 92 is likewise connected between knob 90 and slide arms 39, 80 and 81 of switches 40, 60 and 70, respectively. A knob 100 is connected to slide arm 53 through a mechanical coupling 101. A capacitor 72 is added across the I.F. transformer 62 in order to provide proper coupling for the circuit.

*Operation*

Broadly, the system functions as follows.

An R.F. signal is received at antenna 11*a* and applied through wire 11*b* to R.F. amplifier 12. The signal is then passed through the first mixer 14 and heterodyned with a signal from crystal oscillator 17. The heterodyned signal is applied to the first I.F. stage 16 and to the second mixing stage 19 where it is heterodyned with a signal from crystal oscillator 26. The resultant difference signal is applied through the second I.F. amplifier 20 to detector 22.

In order to carry out the purpose of this invention, the total number of crystals supplied to the oscillator stage 17 was reused. Thus, in order to cover a frequency range from 108.0 megacycles to 117.9 megacycles, five crystals ranging in frequency from 95 megacycles to 99 megacycles were incorporated into the first crystal oscillator 17. The 95 megacycles crystal 30*a* was then connected through a wire 41*a* to terminal 6. The 96 megacycles crystal was connected through a wire 41*b* to terminal 7. The 97, 98 and 99 megacycles crystals were correspondingly connected through wires 41*c* through 41*d* to terminals 8, 9 and 10, respectively. This arrangement provided a crystal for stabilization of the oscillator for each position of the radio frequency selector 90. The beat frequency between the signals from the oscillator 17 and the R.F. amplifier, however, will pass through I.F. transformer 62 for only half of the selector switch position, that is, positions 1 through 5. In order to make the system operative when the crystals are reused, the resonant frequency of transformer 62 must be shifted. This shift is accomplished by switches 60 and 70; thus, as sliding arms 80 and 81 are advanced through positions 1 through 5, the resonant frequency of the transformer and capacitor combination is determined by not only the inductance of the primary 63 and its associating capacitor 65, but also the capacitance of 85. Likewise, the resonant frequency of the secondary is determined not only by the inductance of secondary 64 and its associating capacitors but also by capacitor 86. However, when slide arms 80 and 81 are advanced to positions 6 through 10, capacitors 85 and 86 are dropped from the circuit thereby causing the resonant frequency of the I.F. transformer to increase by a fixed amount. The method for selecting the lower and higher resonant frequencies of transformer 62 is principally determined by the frequency $fo_1$ of the crystal oscillator 17 and the resonant frequency $F_2$ of the second I.F. amplifier 20. For example, if the lowest resonant frequency of the I.F. stage 16 (in positions 1 through 5 of switch 60 or 70) is $F_1$ and if the highest frequency of I.F. stage 16 (in switch positions 6 through 10 of switches 60 or 70) is $F_{1'}$ and if the frequency from crystal oscillator 26 is $fo_2$ and if the resonant frequency of the second I.F. amplifier 20 is $F_2$, then:

$$f_{rf} \text{ minus } fo_1 \text{ equals } F_1 \qquad (1) \text{ (lower half)}$$

and $$f_{rf} \text{ minus } fo_1 \text{ equals } F_{1'} \qquad (2) \text{ (upper half)}$$

where $f_{rf}$ equals the frequency of the signal from the R.F. stage, and $fo_1$ is the frequency of the crystal oscillator 17. As the signal passes to the second I.F. stage, then:

$$fo_2 \text{ minus } F_1 \text{ equals } F_2 \qquad (3) \text{ (lower band)}$$

and $$F_{1'} \text{ minus } fo_2 \text{ equals } F_2 \qquad (4) \text{ (upper band)}$$

In order to illustrate an example showing a group of frequencies that meet the above conditions, an example is set out in Table I showing a group of possible frequencies for the R.F. stage, the first crystal oscillator stage, the second crystal oscillator stage, the first and second tuning frequencies of the first I.F. stage, and the tuning frequency of the second I.F. stage.

TABLE I

| Switch Position | Receiver Channel $f_{rf}$ | 1st xtal. osc. freq. $fo_1$ | $f_{rf}-fo_1=F_1$ | $fo_2$ | $fo_2-F_1=F_2$ |
|---|---|---|---|---|---|
| 1 | 108.0–108.9 | 95.0 | 13.0–13.9 | 15.5–15.9 | +2.5 mc. |
| 2 | 109.0–109.9 | 96.0 | 13.0–13.9 | 15.5–15.9 | +2.5 mc. |
| 3 | 110.0–111.9 | 97.0 | 13.0–13.9 | 15.5–15.9 | +2.5 mc. |
| 4 | 111.0–111.9 | 98.0 | 13.0–13.9 | 15.5–15.9 | +2.5 mc. |
| 5 | 112.0–112.9 | 99.0 | 13.0–13.9 | 15.5–15.9 | +2.5 mc. |
| | | | | | $F_1'-fo_2=F_2$ |
| 6 | 113.0–113.9 | 95.0 | 18.0–18.9 | 15.5–15.9 | +2.5. |
| 7 | 114.0–114.9 | 96.0 | 18.0–18.9 | 15.5–15.9 | +2.5. |
| 8 | 115.0–115.9 | 97.0 | 18.0–18.9 | 15.5–15.9 | +2.5. |
| 9 | 116.0–116.9 | 98.0 | 18.0–18.9 | 15.5–15.9 | +2.5. |
| 10 | 117.0–117.9 | 99.0 | 18.0–18.9 | 15.5–15.9 | +2.5. |

$f_{rf}$=tuning frequency of R.F. stage.
$fo_1$=frequency of first oscillator generator.
$F_1$=tuned frequency of the first I.F. stage—first position.
$F_1'$=tuned frequency of the first I.F. stage—second position.
$fo_2$=frequency of second oscillator generator.
$F_2$=tuned frequency of the second I.F. stage.
NOTE.—The first I.F. stage has a band pass of 900 kc. for each position.

In order to illustrate the use of the table, the following example will be given.

*Example I*

If the R.F. stage were tuned to 110.5 megacycles, switches 40, 60 and 70 would have their sliding contacts 41, 80 and 81, respectively, engaging contact 3. With the switches in this position, crystal 30*c* would be connected through a wire 42 to crystal oscillator 17. In switches 60 and 70, capacitors 85 and 86 will be connected respectively through wires 82 and 83 in parallel with the primary 63 and secondary 64 respectively of transformer 62. Since the radio frequency signal being received on the antenna is 110.5 and the crystal is 97.0, the difference frequency would be 13.5 megacycles. This would easily pass through an I.F. stage tuned between 13 and 13.9 kc. With selector switch 100 positioning sliding contact 53 on contact 5 of switch 50, crystal 51*f* would be connected through the wire 54 to crystal oscillator 26. Since crystal oscillator 26 is 16.0 megacycles and the frequency being supplied to the second mixer is 13.5 megacycles, the difference frequency will be 2.5 megacycles which is the resonant frequency of the second I.F. stage.

*Example II*

If the R.F. stage is tuned to 113.7 megacycles, switches 40, 60 and 70 will have their sliding contacts 41, 80 and 81 on contact 6 of each of the switches. This will engage the 95 megacycle crystal with crystal oscillator 17. Thus, 113.7 minus 97 megacycles results in a beat frequency of 18.7 megacycles. Since the sliding contact of switches 60 and 70 is engaging contact 6, capacitors 85 and 86 will be removed from the resonant circuit of transformer 62. This will cause the transformer to resonate between 18 and 18.9 megacycles. As the beat frequency between 113.7 and 95.0 megacycles is 18.7 megacycles, this signal will easily pass through the I.F. transformer 62.

Knob 100 will be adjusted to move sliding contact 53 down to position 7 to correspond to the fourth digit in the receiver signal. This will engage crystal 51*h* with oscillator 21. Since crystal 51*h* has a frequency of 16.2 megacycles, a beat frequency resulting in the difference between 18.7 megacycles and 16.2 megacycles will result in an output signal of 2.5 megacycles from the second mixer stage 19.

Through the examples, it can be seen that by proper selection of the crystals in oscillator 17 and oscillator 26 along with the proper selection of the frequencies for the first I.F. stage, a substantial reduction in crystals can be obtained for the crystal oscillator 17 without sacrificing stability of the receiver.

The crystals 30*a* through 30*e* have been shown as coupled by a wire 31. It is to be understood by those skilled in the art that the crystals could be coupled any manner suitable to the particular oscillator circuit utilized and the invention is not to be limited to the particular embodiment illustrated. Further, while a system reusing the crystals only once is shown, the crystals could be reused as many times as shifting of the I.F. frequencies will economically permit. In the case where more than one reuse is contemplated, I.F. stage 20 may require shifting as well as I.F. stage 16.

Although this invention has been described with respect to particular embodiments thereof, it is not to be so limited, as changes and modifications may be made therein which are within the spirit and scope of the invention as defined by the appended claims.

What I claim is:

1. A receiving system comprising
 a first series of piezo-electric frequency determining crystals resonant at uniformly spaced frequency increments in an assigned order and which repeat the assigned order at least twice during the tuning of said receiving system through its entire selectable frequency range,
 a second series of piezo-electric frequency determining crystals resonant at frequency increments which are simple fractions of the frequency increments of the crystals of said first series and arranged in a preselected assigned order with each crystal in said second series assigned a single incremental value,
 a first intermediate frequency amplifier having at least two discrete switchable bandpass frequency ranges, each of said ranges being sufficiently wide to pass a frequency range at least as wide as the maximum difference between the lowest and the highest frequency in said second crystal series,
 a serial arrangement comprising a radio frequency amplifier, a first mixer, said first intermediate frequency amplifier, a second mixer, a second intermediate frequency amplifier being fixed tuned to a reference frequency, a first switching means for selectively switching crystals of said first series into the circuit of a first oscillator to determine the frequency thereof,
 means for applying the output of said first oscillator to said first mixer,
 a second oscillator,
 a second switching means for selectively switching crystals of said second series into the circuit of said second oscillator to determine the frequency thereof, said second switching means operable to maintain said crystals in said second series in said assigned order during the switching thereof so that each crystal in said second series relates to only one of said second series frequency increments,
 means for applying the output of said second oscillator to said second mixer,
 means operated by the switching of a crystal of said first series into the circuit of said first oscillator for selecting the frequency range of said first intermediate frequency amplifier to a frequency range which includes the difference of the incoming selected signal frequency minus the selected first oscillator frequency, said operated means operable to allow said first and second series selection means to select crystals in their respective series independently of each other with said crystals in said second series maintaining said preselected singly assigned order and relating to only one assigned frequency increment.

2. The invention as in claim 1 wherein said selected signal frequency minus the selected first oscillator frequency is always a positive difference frequency signal obtained by low-side injection.

3. The invention as in claim 1 wherein said discrete bandpass frequency range is switched by said operated means when said crystals in said first series are caused to repeat during the tuning of said receiving system.

References Cited

UNITED STATES PATENTS

| | | | |
|---|---|---|---|
| 2,113,157 | 4/1938 | Landon et al. | 325—462 |
| 2,487,857 | 11/1945 | Davis | 325—433 |
| 2,654,832 | 10/1953 | Robinson | 325—432 |
| 2,902,596 | 9/1959 | Rockwell et al. | 325—460 |
| 3,085,202 | 4/1963 | Jakubowics | 325—432 |

KATHLEEN H. CLAFFY, *Primary Examiner.*

A. H. GESS, *Assistant Examiner.*